(12) United States Patent
Cole et al.

(10) Patent No.: US 7,056,820 B2
(45) Date of Patent: Jun. 6, 2006

(54) BOND PAD

(75) Inventors: Stephen P. Cole, Winooski, VT (US); William J. Murphy, North Ferrisburgh, VT (US); Barbara A. Waterhouse, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 10/707,089

(22) Filed: Nov. 20, 2003

(65) Prior Publication Data
US 2005/0112794 A1 May 26, 2005

(51) Int. Cl.
*H01L 21/4763* (2006.01)
(52) U.S. Cl. ........................ 438/618; 257/774
(58) Field of Classification Search ................ 438/618, 438/637, 652, 687, 688; 257/750, 762, 765, 257/771, 774
See application file for complete search history.

(56) References Cited

U.S. PATENT DOCUMENTS

| | | | |
|---|---|---|---|
| 5,225,372 A | 7/1993 | Savkar et al. | |
| 5,290,588 A | 3/1994 | Romero et al. | |
| 5,356,836 A | 10/1994 | Chen et al. | |
| 5,990,011 A | 11/1999 | McTeer | |
| 6,037,668 A | 3/2000 | Cave et al. | |
| 6,130,156 A * | 10/2000 | Havemann et al. | 438/637 |
| 6,175,154 B1 | 1/2001 | Gillespie | |
| 6,417,572 B1 | 7/2002 | Chidambarrao et al. | |

* cited by examiner

*Primary Examiner*—David Vu
(74) *Attorney, Agent, or Firm*—Schmeiser, Olsen & Watts; William D. Sabo

(57) ABSTRACT

A bond pad upon which a wirebond interconnection is formed, consisting of a first bond pad layer formed on a chip, and a second bond pad layer formed on the first bond pad layer, wherein the first bond pad layer is more resistant to removal than the second bond pad layer during probe testing, and the first bond pad layer increases resistance to interconnection failure during mechanical testing.

17 Claims, 2 Drawing Sheets

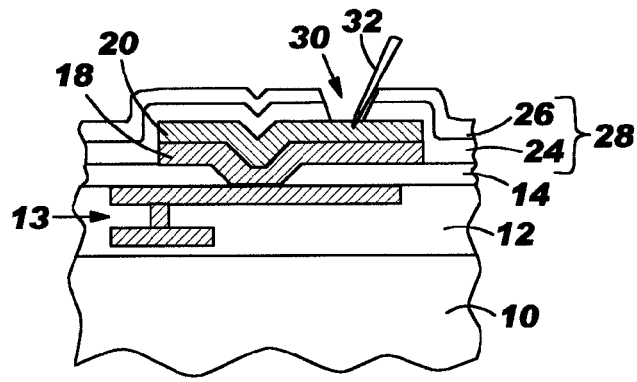
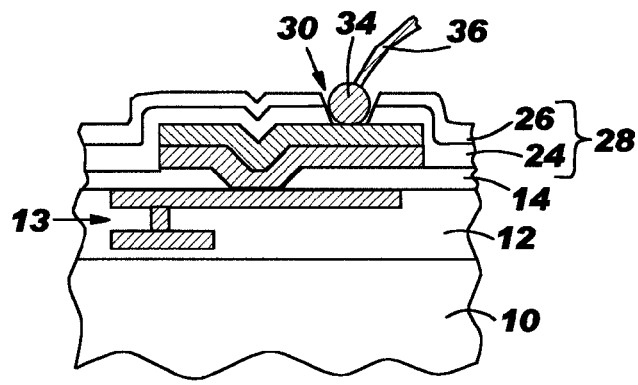
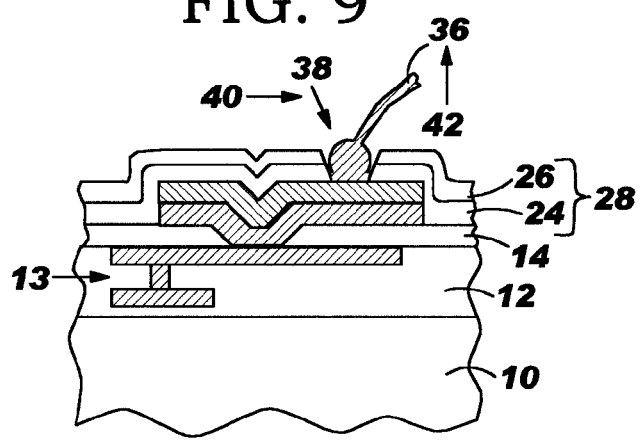

BOND PAD

BACKGROUND OF INVENTION

1. Technical Field

The present invention relates generally to semiconductor devices, and more particularly, to the design of bond pads for wirebond interconnections.

2. Related Art

Wirebonding is commonly used to form an electrical interconnection between an integrated circuit and another device, e.g., lead frame, interposer, or printed circuit board. Attaching a wirebond to an active region of a chip consists of pressing a wirebond ball, having a conductive wire attached thereto, into a bond pad.

Before being used in a final product, or sent to an end user, the chip must be tested to ensure product reliability. Such testing may be performed on the chip before or after wirebonding, depending upon the design of the bond pad. A probing device is used to measure open or closed electrical systems. During probing a probe tip contacts a surface of the bond pad to measure electrical conduction. There is often a layer of oxide, or "skin", on the surface of the bond pad that was created during formation of the bond pad. Therefore, sufficient down force is required when contacting the bond pad surface with the probe tip to penetrate the skin. Otherwise, erroneous readings may be produced, resulting in the discarding of functioning chips. Due to the downward force of the probe tip some of the bond pad material is removed during probing. As a result, the amount of bond pad material available for wirebonding is also reduced. Also, due to the uneven topography on the surface of the bond pad, the probe tip often gouges the bond pad material, leaving a pile up of bond pad material on the surface of the bond pad, and on the probe tip itself. The pile up of bond pad material on the surface of the bond pad may result in Kirkendal Voiding, wherein voids within the interconnection are produced during wirebonding as the excess bond pad material in the pile up is consumed by the wirebond ball. The excess bond pad material on the probe tip must also be cleaned frequently causing production delays.

By minimizing the amount of bond pad material, the above-stated problems are reduced. There is, therefore, a process window for bond pad thickness that minimizes the amount of bond pad removal and pile up. For example, an optimal process window for thickness of the bond pad may be 300–800 nm, e.g., 400 nm, for tight pitch wirebond products, e.g., a pitch of less than 65 nm, pitch referring to the width of the bond pad and the spacing between bond pads.

However, after the wirebond interconnection is formed some of the interconnections must withstand at least two mechanical tests, namely, a stud pull test and a ball shear test, to qualify the interconnection formation process for further use. The resistance of the interconnection to mechanical failure depends upon the pad thickness. In particular, the interconnection typically performs better during these tests as the amount of bond pad material is increased. Therefore, the process window for bond pad thickness during wirebond mechanical testing may be 800–1500 nm, e.g., 1000 nm, for a tight pitch wirebond product.

Clearly, there is a problem in forming a bond pad having sufficient bond pad material to pass the mechanical tests performed on the wirebond interconnection, and at the same time minimize the amount of bond pad material to reduce the removal and pile up of bond pad material during probing.

Therefore, there is a need in the industry for a bond pad that overcomes the above problems

SUMMARY OF INVENTION

The present invention provides a bond pad upon which a wirebond interconnection is to be formed that solves the above-stated problems.

A first aspect of the invention provides a method of forming a bond pad for use in a wirebond interconnection, comprising: depositing a first layer of bond pad material on a substrate; and depositing a second layer of bond pad material on the first layer, wherein the first layer has a higher Young's Modulus of Elasticity than the second layer.

A second aspect of the invention provides a method of forming a bond pad for use in a wirebond interconnection, comprising: depositing a first layer of bond pad material on a substrate; and depositing a second layer of bond pad material on the first layer, wherein a hardness of the first layer is greater than a hardness of the second layer.

A third aspect of the invention provides semiconductor device, comprising: a first layer formed on a substrate; and a second layer on the first layer, wherein the first layer of the bond pad has a higher Young's Modulus of Elasticity than the second layer.

The foregoing and other features and advantages of the invention will be apparent from the following more particular description of the embodiments of the invention.

BRIEF DESCRIPTION OF DRAWINGS

The embodiments of this invention will be described in detail, with reference to the following figures, wherein like designations denote like elements, and wherein:

FIG. 7 depicts the chip of FIG. 6 during probe testing;

FIG. 8 depicts the chip of FIG. 7 having a wirebond ball pressed into the bond pad; and FIG. 9 depicts the chip of FIG. 8 having a wirebond interconnection formed on the bond pad.

DETAILED DESCRIPTION

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
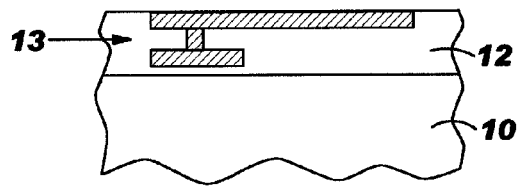
FIG. 1 depicts a portion of an integrated circuit chip having a metallization level thereover.

FIG. 1 depicts a portion of a chip 10 typically used in integrated circuit devices. The portion of the chip 10 illustrated in FIG. 1 is the portion having the active circuitry therein. A metallization level 12 is formed over the surface of the chip 10 as is known in the art. The metallization level 12 contains metal lines and vias 13, formed using processes known in the art. For ease of illustration, the metallization level 12 of the present example contains two metal lines and one via forming an electrical interconnection between the two metal lines. The metal lines and vias 13 within the metallization level 12 may consist of tantalum-nitride having a tantalum barrier surrounding the metal lines and vias 13, or copper or copper alloys having a barrier comprising titanium-nitride, or other hard refractory metal, when used on combination with a copper interconnect (described infra), or tungsten when used on combination with an aluminum interconnect.

Figure 2:
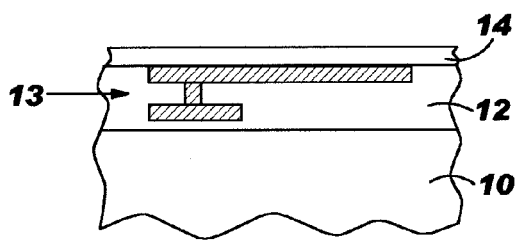
FIG. 2 depicts the chip of FIG. 1 having an oxide layer thereover.

As illustrated in FIG. 2, an oxide layer 14 is formed over the surface of the metallization level 12. The oxide layer 14 may be formed using a plasma oxide deposition process, a TEOS based chemical-vapor deposition (CVD) process, or a plasma assisted CVD oxide deposition process. The oxide layer 14 may comprise a dielectric material such as polyimide, silicon dioxide, silicon nitride, fluorine doped oxide, or other low-k dielectrics.

Figure 3:
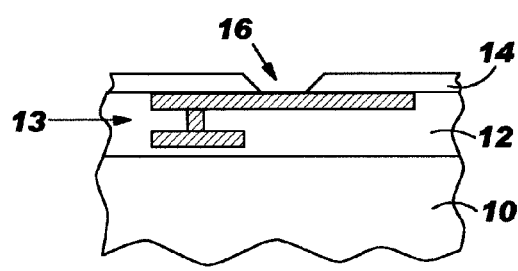
FIG. 3 depicts the chip of FIG. 2 having a via formed within the oxide layer.

As illustrated in FIG. 3, a via 16 is formed within the oxide layer 14 in a region of the chip 10 where the metal lines 13 are located in order to make electrical interconnection between the metal lines 13 of the metallization level 12 and the wirebond interconnection (formed infra). The via 16 is etched down to the surface of the metallization level 12, using a photolithography pattern and plasma etch process, or other similarly used processes.

Figure 4:
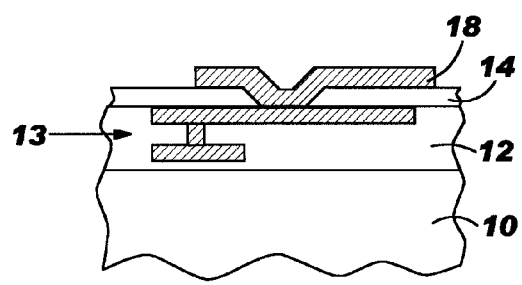
FIG. 4 depicts the chip of FIG. 3 having a first bond pad layer formed within the via of the oxide layer.

As illustrated in FIG. 4, a first layer of a bond pad, or first bond pad layer 18 is deposited over at least a portion of the oxide layer 14. The first bond pad layer 18 conformally coats the via 16 within the oxide layer 14, and extends beyond the blueprint of the via 16. The first bond pad layer 18 may comprise $TiAl_x$, e.g., $TiAl_3$, or other aluminum alloys having at least 2% titanium, 2% copper, 2% silicon, 2% tungsten, or other similar material. The Young's Modulus of Elasticity of the material selected for the first bond pad layer 18 is about 100 GPa, or greater and a hardness of about 0.8 or greater. The first bond pad layer 18 may be sputter deposited onto the surface of the oxide layer 14 using a plasma vapor deposition (PVD) technique, or other similar technique, to a thickness of about 100–800 nm.

Figure 5:
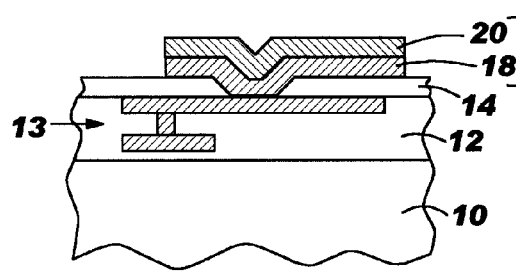
FIG. 5 depicts the chip of FIG. 4 having a second bond pad layer formed over the first bond pad layer within the via of the oxide layer.

As illustrated in FIG. 5, a second layer of the bond pad, or second bond pad layer 20 is then deposited on the surface of the first bond pad layer 18, and may comprise aluminum, aluminum-copper alloys, aluminum-titanium alloys, or other similarly used materials. The second bond pad layer 20 is formed using a PVD process, or other similarly used process. The second bond pad layer 20 may be formed having a thickness of about 100–600 nm. The first and second bond pad layers 18, 20 form a bond pad stack or bond pad 22, having a total thickness less than, or equal to 1200 nm. It should be noted that the thickness of each of the first and second bond pad layers 18, 20 may be adjusted as needed. The bond pad 22 is electrically connected to the active region of the chip 10 through the metal lines and vias 13 within the metallization level 12. Customarily a bond pad comprises only a single layer of material, for example, primarily Al and its alloys. A single layer bond pad composed primarily of Al has a Young's Modulus of Elasticity of about 88 GPa, or less than about 90 GPa, and a hardness of about 0.6 GPa. The present invention, however, replaces a portion of the conventional aluminum bond pad with the first bond pad layer 18 such that the total bond pad thickness required for a particular application is maintained, but the amount of aluminum is reduced. As mentioned above, the first bond pad layer 18 has a Young's Modulus of Elasticity of about 100 GPa or greater, and a hardness of about 0.8 GPa. The higher Youn's Modulus of Elasticity and hardness makes the first bond pad layer 18 more resistant to the probe testing than the second bond pad layer 20. As a result, less of the bond pad 22 is removed during probe testing, therefore, sufficient bond pad material is still present at the time of wirebonding. In addition, the Young's Modulus of Elasticity of the first bond pad layer 18 increases the resistance of the wirebond interconnection (formed infra on the bond pad 22) to mechanical failure during mechanical tests performed on the wirebond interconnection.

Figure 6:
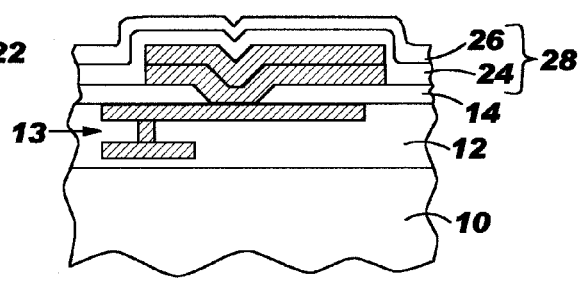
FIG. 6 depicts the chip of FIG. 5 having a final passivation layer over the surface of the chip.

Following formation of the bond pad 22 an oxide nitride layer 24 is deposited over the surface of the chip 10, using a CVD process, a plasma assisted CVD process, or other similarly used process (FIG. 6). Thereafter, a photosensitive polyimide (PSPI) resist layer 26 is deposited over the surface of the oxide nitride layer 24. The oxide nitride layer 24 and the PSPI layer 26, which together form a final passivation layer 28, are then cured. For example, the final passivation layer 28 is exposed to a temperature of about 350° C. for about 1 hour and 30–45 minutes. The curing process causes the final passivation layer 28 to shrink from a thickness of about 12 microns to about 6 microns, thereby sealing the surface of the chip 10. The final passivation layer 28 serves to protect and insulate the chips 10 from damage during packaging and probe testing.

Thereafter, a via 30 is etched in the final passivation layer 28 down to the second layer 20 of the bond pad 22, using a photoetching process, or other similarly used process, to expose the bond pad 22 for probe testing and wirebonding (described infra) (FIG. 7).

FIG. 7 illustrates the probe testing process performed on the bond pad 22. In particular, the probe tip 32 penetrates the second layer 20 of the bond pad 22. The first layer 18 of the bond pad 22, however, is hard enough to resist penetration by the probe tip 32. Because the probe tip 32 is unable to penetrate the first layer 18 of the bond pad 22 not as much of the bond pad material is removed, and pile up of bond pad material on the surface of the chip 10 and on the probe tip 32 is reduced. In fact, the first layer 18 of the bond pad 22 is not removed by the probe tip 32, and the portion of the second layer 20 that may be removed by the probe tip 32 is smaller it would have been had the entire bond pad 22 thickness been formed of the aluminum. As a result, less of the total bond pad 22 is removed during probing. Additionally, because there is a reduced occurrence of pile up of removed bond pad material on the surface of the chip 10, the occurrence of Kirkendal Voiding (described supra), a known failure mechanism of the related art, is also reduced.

Thereafter, a wirebond or ball 34, having a wire 36 affixed thereto, is pressed onto the bond pad 22, as shown in FIG. 8. The ball 34 may comprise gold, or other similarly used material. The wire 36 may comprise copper, or other similarly used material. The ball 34 undergoes a thermal cycling process whereby in this example, at least a portion of the aluminum within the second bond pad layer 20 is consumed by the gold ball 34 forming an Au/Al intermetallic wirebond interconnection 38, as illustrated in FIG. 9. The interconnection 38 securely affixes the wire 36 to the bond pad 22 thereby providing electrical connection between a lead frame (not shown) and the chip 10.

Mechanical tests may be performed on the interconnection 38 to ensure stability of the interconnection 38 and qualify the formation process for further use. For example, a ball shear test and a stud pull test may be performed. During the ball shear test a force is applied to the interconnection 38 in the direction of arrow 40. The force necessary to shear the interconnection 38 is measured. During the stud pull test an upward force, a force in the direction of arrow 42, is applied to the wire 36. The force required to break the interconnection 38 is measured.

As mentioned above, the bond pad 22 of the present invention is more resistant to removal of the bond pad material during probing. Accordingly, more of the bond pad 22 is present at the time of wirebond interconnection 38 formation. As a result, a better interconnection 38 is formed, therefore, a greater force is needed to break the interconnection 38 during the ball shear test and the stud pull test. Additionally, the material selected for the first layer 18 of the bond pad 22 has a higher Young's Modulus of Elasticity and hardness than the aluminum in the second layer 20. This also increases the resistance of the bond pad 22 and the interconnection 38 to the forces applied to the interconnection 38 during the mechanical tests. Furthermore, because the bond pad 22 is more resistant to removal during probe testing, there is less excess bond pad material on the probe tip. This reduces the necessity to clean the probe tip as frequently, thereby minimizing production delays.

The invention claimed is:

1. A method of forming a bond pad for use in a wirebond interconnection, comprising:
    forming a first non-conductive layer in direct mechanical contact with a surface of a substrate, wherein the first non-conductive layer comprises a via extending down to the surface of the substrate;
    depositing a first layer of bond pad material in direct mechanical contact with a surface of the first non-conductive layer, wherein the first layer of bond pad material fills the via and extends beyond the via onto the surface of the first non-conductive layer;
    depositing a second layer of bond pad material in direct mechanical contact with the first layer of bond pad material, wherein the first and second layers of bond pad material on the surface of the first non-conductive layer extending beyond the via form a bond pad region, and wherein the first layer of bond pad material has a higher Young's Modulus of Elasticity than the second layer of bond pad material;
    depositing a second non-conductive layer over the second layer of bond pad material, wherein the second non-conductive layer is in direct mechanical contact with the bond pad region of the second layer of bond pad material;
    forming an opening within the second non-conductive layer down to the bond pad region of the second layer of bond pad material; and
    forming a wirebond interconnection within the opening within the second non-conductive layer in mechanical and electrical connection with the second layer of bond pad material.

2. The method of claim 1, wherein the first layer comprises a material selected from the group consisting of: $TiAl_x$, an aluminum alloy having at least 2% titanium, an aluminum alloy having at least 2% copper, an aluminum alloy having at least 2% silicon, and an aluminum alloy having at least 2% tungsten; and the second layer comprises of a material selected from the group consisting of: aluminum, aluminum-copper alloys, and aluminum-titanium alloys.

3. The method of claim 1, wherein the Young's Modulus of Elasticity of the second layer is less than about 90 GPa, and the Young's Modulus of Elasticity of the first layer is at feast about 100 GPa or greater.

4. The method of claim 1, wherein the first layer of bond pad material is more resistant to penetration by a probe tip during probe testing than the second layer of bond pad material.

5. The method of claim 1, wherein the first layer of bond pad material is more resistant to mechanical failure than the second layer of bond pad material during mechanical testing of the wirebond interconnection.

6. A method of forming a bond pad for use in a wirebond interconnection, comprising:
    forming a first non-conductive layer in direct mechanical contact with a surface of a substrate, wherein the first non-conductive layer comprises a via extending down to the surface of the substrate;
    depositing a first layer of bond pad material in direct mechanical contact with a surface of the first non-conductive layer, wherein the first layer of bond pad material fills the via and extends beyond the via onto the surface of the first non-conductive layer;
    depositing a second layer of bond pad material in direct mechanical contact with the first layer of bond pad material, wherein the first and second layers of bond pad material on the surface of the first non-conductive layer extending beyond the via form a bond pad region, and wherein a hardness of the first layer of bond pad material is greater than a hardness of the second layer of bond pad material;
    depositing a second non-conductive layer over the second layer of bond pad material, wherein the second non-conductive layer is in direct mechanical contact with the bond pad region of the second layer of bond pad material;
    forming an opening within the second non-conductive layer to the bond pad region of the second layer of bond pad material; and
    forming a wirebond interconnection within the opening in the second non-conductive layer in mechanical and electrical connection with the second layer of bond pad material.

7. The method of claim 6, wherein the hardness of the first layer is about 0.8 GPa and The hardness of the second layer is about 0.6 GPa.

8. The method of claim 6, wherein the first layer comprises a material selected from the group consisting of $TiAl_x$, an aluminum alloy having at least 2% titanium, an aluminum alloy having at least 2% copper, an aluminum alloy having at least 2% silicon, and an aluminum alloy having at least 2% tungsten; and the second layer comprises of a material selected from the group consisting of: aluminum, aluminum-copper alloys, and aluminum-titanium alloys.

9. The method of claim 6, wherein the first layer of bond pad material is more resistant to penetration by a probe tip during probe testing than the second layer of bond pad material.

10. The method of claim 6, wherein the first layer of bond pad material is more resistant to mechanical failure than the second layer of bond pad material during mechanical testing of a the wirebond interconnection.

11. A semiconductor device, comprising:
    a first non-conductive layer in direct mechanical contact with a surface of a substrate, wherein the first non-conductive layer comprises a via extending down to the surface of the substrate;
    a first layer in direct mechanical contact with a surface of the first non-conductive layer, wherein the first layer fills the via and extends beyond the via onto the surface of the first non-conductive layer;

a second layer on in direct mechanical contact with the first layer, wherein the first and second layers on the surface of the first non-conductive layer extend beyond the via to form a bond pad region, wherein the first layer has a higher Young's Modulus of Elasticity than the second layer;

a second non-conductive layer in direct mechanical contact with the bond pad region of the second layer having an opening within the second non-conductive layer down to the bond pad region of the second layer; and a wirebond interconnection within the opening within the second non-conductive layer forming an electrical connection with the second layer.

12. The semiconductor device of claim 11, wherein the first layer comprises a material selected from the group consisting of: $TiAl_x$, an aluminum alloy having at least 2% titanium, an aluminum alloy having at least 2% copper, an aluminum alloy having at least 2% silicon, and an aluminum alloy having at least 2% tungsten; and the second layer comprises of a material selected from the group consisting of: aluminum, aluminum-copper alloys, and aluminum-titanium alloys.

13. The semiconductor device of claim 11, wherein the first layer is more resistant to mechanical failure than the second layer during mechanical testing of the wirebond interconnection.

14. The semiconductor device of claim 11, wherein the first layer is more resistant to penetration by a probe tip during probe testing than the second layer.

15. The semiconductor device of claim 11, wherein the Young's Modulus of Elasticity of the second layer is less than about 90 GPa, and die Young's Modulus of Elasticity of the first layer is at least about 100 GPa or greater.

16. The semiconductor device of claim 11, wherein the hardness of die first layer is about 0.8 GPa and the hardness of the second layer is about 0.6 GPa.

17. The semiconductor device of claim 11, wherein the second non-conductive layer comprises an oxide layer.

* * * * *

UNITED STATES PATENT AND TRADEMARK OFFICE
CERTIFICATE OF CORRECTION

PATENT NO.       : 7,056,820 B2                              Page 1 of 1
APPLICATION NO. : 10/707089
DATED            : June 6, 2006
INVENTOR(S)      : Cole et al.

It is certified that error appears in the above-identified patent and that said Letters Patent is hereby corrected as shown below:

Column 4
Line 5, delete "Youn's" and insert -- Young's --

Column 6
Line 2, delete "feast" and insert -- least --
Line 43, delete "The" and insert -- the --
Line 60, delete "a"

Column 7
Line 3, delete "on"

Column 8
Line 13, delete "die" and insert -- the --
Line 16, delete "die" and insert -- the --

Signed and Sealed this

Twenty-second Day of August, 2006

JON W. DUDAS
*Director of the United States Patent and Trademark Office*